United States Patent [19]

Christensen et al.

[11] Patent Number: 4,544,619
[45] Date of Patent: Oct. 1, 1985

[54] PHOTOSENSITIVE LAMINATE

[75] Inventors: Carl W. Christensen; Calvin Isaacson, both of Beverly, Mass.

[73] Assignee: Shipley Company Inc., Newton, Mass.

[21] Appl. No.: 584,775

[22] Filed: Feb. 29, 1984

Related U.S. Application Data

[60] Division of Ser. No. 253,865, May 16, 1972, Pat. No. 4,530,896, which is a continuation of Ser. No. 16,145, Mar. 3, 1970, abandoned.

[51] Int. Cl.⁴ .................. G03C 11/12; G03C 5/00; G03F 7/26
[52] U.S. Cl. .................. 430/258; 430/145; 430/155; 430/166; 430/256; 430/259; 430/271; 430/273; 430/323; 430/324; 430/325; 430/326
[58] Field of Search .............. 430/258, 256, 259, 262, 430/263, 323, 324, 143, 145, 155, 160, 162, 167, 166, 271, 272, 273, 325, 326

[56] References Cited

U.S. PATENT DOCUMENTS

| | | | |
|---|---|---|---|
| 3,402,044 | 9/1968 | Steinhoff et al. | 430/292 |
| 3,458,311 | 7/1969 | Alles | 430/273 |
| 3,492,121 | 1/1970 | Yackel | 430/262 |
| 3,526,504 | 9/1970 | Coleste | 430/271 |
| 3,573,975 | 4/1971 | Dhaka et al. | 430/271 |
| 3,884,693 | 5/1975 | Bauer et al. | 430/263 |

Primary Examiner—Charles L. Bowers, Jr.
Attorney, Agent, or Firm—Robert L. Goldberg

[57] ABSTRACT

This invention relates to a light sensitive laminate comprising a light sensitive layer of photoresist, a support therefor, and an intermediate protective layer preferably of a light transmitting material disposed between said photoresist layer and said support. In use, the photoresist layer of the laminate is adhered to a base material and the support stripped therefrom, thereby leaving a composite comprising the base material, photoresist layer and intermediate protective layer disposed over said photoresist layer. The intermediate layer serves to protect the photoresist layer from damage such as by abrasion or otherwise during processing, thereby permitting storage of the so-formed composite prior to use. Since the intermediate layer may be of a light transmitting material, photoimaging may take place through the intermediate layer with the intermediate layer subsequently removed by contact with a solvent that is a non-solvent for those areas of photoresist left after development.

10 Claims, 3 Drawing Figures

PHOTOSENSITIVE LAMINATE

This is a division of application Ser. No. 253,865 filed May 16, 1972, now U.S. Pat. No. 4,530,896, which, in turn, is a continuation of U.S. application Ser. No. 16,145 filed Mar. 3, 1970, and now abandoned.

BACKGROUND OF THE INVENTION

1. Field of the Invention

This invention relates to photoresists and more particularly, to the application of photosensitive coatings to substrates such as circuit board base materials used in the production of printed circuit boards and the like.

2. Description of the Prior Art

Photosensitive or light sensitive resists are thin coatings which, when exposed to light of the proper wave length, are chemically changed in their solubility characteristics to certain solvents or developers. Two types are available, negative acting and positive acting resists. Prior to exposure, negative acting resists are soluble in developer, but with light exposure, undergo chemical change and become insoluble in said developer. Exposure is done through a film pattern and the unexposed photoresist is selectively dissolved, softened or washed away, leaving the desired resist pattern on a substrate. Positive acting resists work in the opposite manner, light exposure making the resist soluble in developer. The resist pattern that remains after development (and post-baking in some cases) is insoluble and chemically resistant to cleaning, plating and etching solutions used in processes of this nature. Typical examples of positive acting photosensitive materials are the naphthoquinone-(1,2)-diazide sulfonic acid esters disclosed of U.S. Pat. No. 3,046,118. Other photosensitive materials are known in the art.

Processes involving the formation of a coating of photoresist such as in the formation of printed circuit boards, photolithographs, nameplates and the like, are known. In one process for the formation of a printed circuit board, a metal clad base sheet is coated with a photoresist composition and the photoresist is exposed through a positive or negative of the desired image. The light exposed areas of the resist are rendered soluble by exposure and then are washed with a developer to leave the underlying metal layer exposed. An etchant in which the resist is impervious may be used to etch away the exposed metal, or selective plating or other processes may be accomplished and there remains a layer in the desired image pattern. The remaining resist may or may not be removed as desired.

In connection with processes for making printed circuit boards is the provision for and plating of through holes. These holes extend between opposite surfaces of the base sheet and are used to form an electrical connection between said surfaces. Typically, they may be catalyzed and plated with an electroless plating solution.

The surface coating of the resist necessary for the above process has in the past been applied to surface base materials in liquid form using squeegies, rollers or wicks, by dipping, by spraying or wiping, or the like, to form a layer of liquid resist on the base material followed by solidification of the resist. A number of drawbacks attend these liquid methods of application. For example, the resist in liquid form is frequently forced into the through holes where it (a) may not become sufficiently exposed to become soluble, or (b) may not be dissolved in a reasonable time. In either event, the presence of a residuum of resist in the through holes prevents copper plating therein.

Plugging of through holes is avoided by the process of copending U.S. Pat. No. 3,629,036, incorporated herein by reference, where a dry laminate is provided comprising a layer of photoresist and a backing substrate therefor. The materials of the photoresist and the backing layer are selected so that the resist is insoluble in a solvent for the backing. The laminate with the photoresist layer face downward is adhered to a base material, preferably, a metal such as copper or unclad and the backing layer is washed from the composite so formed with a solvent that will not solvate or affect the photoresist layer, thereby leaving a uniform layer of photoresist adhered to the substrate, but not forced into the through holes. In a preferred embodiment, the laminate comprises a water insoluble photoresist material and a water soluble backing, preferably a water soluble paper comprising carboxymethyl cellulose.

An additional technique for applying photoresist layers is disclosed in U.S. Pat. No. 3,469,982 where a resist is first coated as a film on a backing sheet and while still on the backing sheet, the film is adhered by means of heat and/or pressure to a substrate. The backing sheet may be transparent and the film may be exposed through the sheet. Before developing the photoresist, the backing sheet is cut to size and removed by stripping it from the photoresist layer. Though this technique solves some of the problems heretofore mentioned, such as plugging of through holes, and it provides a sufficiently thick coating of photoresist, it introduces additional problems and disadvantages of its own.

One example of a difficulty with the technique of said U.S. Pat. No. 3,469,982 is that the backing layer must be stripped or torn from the photoresist layer. Therefore, the physical characteristics of the photoresist layer become critical. For example, it has been found that thick photoresist layers, i.e., one mil or more, are desirable to avoid wrinkling during application and tearing of the layer upon stripping of the backing. This results in substantially greater cost, poorer resolution of developed images, and longer exposure time. Moreover, the photoresist film may not be brittle or it will fracture. This requires careful compounding of the light sensitive compound with various compatible resin systems.

In addition to the above, since the backing sheet must physically support the photoresist layer, it must have requisite strength properties. Therefore, the backing sheet must have a relatively thick dimension, typically more than one mil in thickness or more. When the photoresist layer is exposed through the backing sheet, the light passing through the sheet becomes diffused or scatters due to the thickness of the sheet, and consequently, image resolution is adversely affected.

A further problem with the technique of said patent relates to cutting and stripping of the support layer. The film of photoresist and support layer is typically fed continuously from a feed roll and adhered to the substrate material by heat and pressure. Since it serves as a protective layer and is not removed until development, it must be cut to the size of the substrate, typically before exposure, and then stripped from the substrate prior to development. This creates problems where automated equipment is used. It is especially difficult to strip the support layer as processing frequently secures the edges thereof to the substrate.

STATEMENT OF THE INVENTION

The present invention overcomes the difficulties noted above by providing a light sensitive laminate comprising a light sensitive layer of photoresist, a support layer therefor, and an intermediate protective layer of a light transmitting material disposed between said photoresist layer and said support layer. In use, the photoresist layer of the laminate is adhered to a base material by any means including heat and/or pressure or by means of an adhering agent as disclosed in the above noted U.S. Pat. No. 3,629,042. Thereafter, the support layer is stripped from the laminate leaving a composite comprising the base material to which has been adhered, the intermediate protective layer beam over said photoresist layer.

The light sensitive laminate of this invention provides numerous advantages over the light sensitive laminate described above in U.S. Pat. No. 3,469,982. For example, since the intermediate protective layer is not required for physical support of a photosensitive layer, it may be relatively thin relative to the photoresist layer and yet provide as good protection as the relatively thick support layer of said patent. Moreover, photoimaging may take place through the intermediate layer with minimal diffusion of light, thereby resulting in a sharper image pattern and a shorter exposure time. In addition, since the intermediate layer lends thickness to the laminate, the photoresist layer may be correspondingly thinner as a thick layer is not required to avoid tearing when the backing layer is stripped from a laminate adhered to a base material. Consequently, image resolution is improved and the overall cost of the laminate is decreased. As a further advantage, the support layer may be stripped prior to cutting to size since the protective intermediate layer is left over the photoresist layer. This eliminates the aforesaid problems associated with automated equipment and stripping of the support layer as well as will be illustrated in greater detail below.

DESCRIPTION OF THE PREFERRED EMBODIMENT

Figure 1:
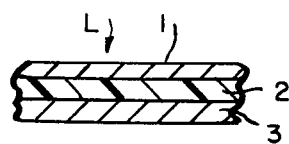
FIG. 1 is an enlarged cross section of a photosensitive laminate in accordance with a preferred embodiment of the invention.

In FIG. 1 of the drawings, there is illustrated a laminate L prepared in accordance with a preferred embodiment of this invention. The laminate comprises a support layer 1, an intermediate protective layer 2, and a light sensitive or photoresist layer 3.

A suitable support layer 1 may be chosen from a wide variety of materials such as paper, cloth fabric and high polymer film such as polyamides, polyolefins, polyesters, vinyl polymers and cellulose esters. A preferred material is paper, most preferably a release paper which has been sized for smoothness. The thickness of the support layer is not critical and typically may vary between 1.5 and 6 mils.

The light sensitive or photoresist layer 3 comprises a resist material preferably in a polymeric binder. Most available prior art positive and negative resists are suitable for the invention. They need only to be coatable onto the support layer and sufficiently flexible in the form of a film.

Included in a resist composition may be a resin or a combination of resins as is known in the art, for example, the combination of a Novolak resin with polystyrene. The thickness of the resist layer in dry film form is not critical, but it is an object of the invention to maintain the layer thin to improve image quality and reduce cost. Consequently, a preferred maximum thickness is 2.5 mils and a preferred range of thicknesses varies between 0.1 and 1.5 mils.

Examples of suitable photoresist materials are disclosed in U.S. Pat. Nos. 3,046,110; 3,046,118; 3,102,809; 3,130,0049; 3,174,860; 3,230,087; 3,264,837; 3,149,983; 3,264,104; 3,288,608 and 3,427,162, all incorporated herein by reference. Preferred light sensitive materials are diazo and diazide materials. Other suitable light sensitive materials include cinnamic acid, vinylcinnomalalcetophenolene polymers such as those disclosed in U.S. Pat. No. 2,716,102; vinyl benzal acetophenones as disclosed in U.S. Pat. No. 2,716,103; diazo sulphonates such as those of U.S. Pat. No. 2,854,388; vinyl azidophthalate polymers of U.S. Pat. No. 2,870,011; and the like. None of the aforementioned light sensitive or photoresist materials consist of or contain a photographic silver halide emulsion.

The intermediate layer 2 is intended to act as a protective film for the photoresist layer 3 after the laminate is adhered to a base material and the support layer 1 is stripped therefrom. As such, it should provide a smooth, hard surface. Where exposure is to take place through the intermediate layer, it should be optically transmitting and be of a material that is soluble in a non-solvent for the portions of the photoresist not removed by developer. Preferably, the intermediate layer is water soluble or soluble in a developer for the resist material so that following exposure, the intermediate layer can be removed by a simple washing operation that preferably also develops the photoresist. Using water or alkali developable photoresists, preferred materials for the intermediate layer include water soluble salts of the group consisting of polyvinyl ether maleic anhydride copolymers, water soluble cellulose ethers, water soluble salts of carboxyalkylcellulose, water soluble salts of carboxyalkyl starch, polyvinyl alcohol, polyvinyl pyrrolidone, various polyacrylamides, various water soluble polyamides, water sluble salts of polyacrylic acid, gelatin, ethylene oxide polymers, various starches and the like. Other materials should be readily apparent to those skilled in the art and will be in part suggested by the choice of the photoresist material.

The thickness of the intermediate protective layer is not critical, but is preferably thin to provide for photoimaging therethrough with minimal diffusion or scattering of light rays as is the problem with the support layer of the aforesaid U.S. Pat. No. 3,469,982. This is especially important with precision work. In accordance with the preferred embodiment of the invention, the intermediate protective layer is maintained relatively thin because it is not needed for support and need be only thick enough to protect the photoresist layer. In general, the intermediate layer preferably has a dry film maximum thickness of 1 mil and preferably varies between 0.1 and 0.3 mils.

The method of forming the light sensitive laminate of the invention is in accord with known procedures such as by roller coating or spraying solutions of the materials of the intermediate layer and then the resist onto the support layer.

Figure 2:
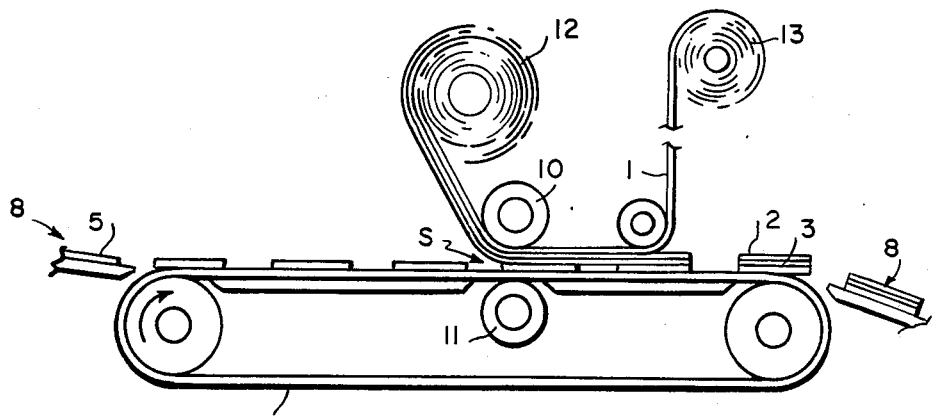
FIG. 2 is a side elevation of a typical apparatus used to apply the light sensitive laminate to a base material.

FIG. 2 illustrates an apparatus in accordance with the invention which may be used to apply photoresist continuously to a succession of pre-cut substrates 5 used as a base material for printed circuit boards, semiconductor parts, nameplates or the like. The substrate 5 typically comprises metals, ceramics, plastics or semiconductor materials. For printed circuit board manufacture using a subtractive process, the substrate typically comprises a layer of plastic 6, for example, phenolic or ABS, and may be clad as illustrated (FIG. 3) with a layer of metal 7, for example, copper foil. The present example of printed circuit board making, of course, does not exhaust the possible applications of the invention which finds uas as well as the graphic arts, the making of decals and nameplates, chemical milling, etching and in any field in which a photoresist is to be put on a substrate made from whatever composition is expedient. Substrates 5 are fed from a delivery slide 8 to an endless belt 9 or other transfer means which transfer them to a transfer station S where upper and lower heated pressure rolls 10 and 11 cause the light sensitive laminate to become adhered to the base material. A suitable temperature for heat bonding to the substrate may vary within rather broad limits, but temperatures of from 40° C. to approximately 150° C. are appropriate depending upon the materials of the light sensitive laminate. Conditions disclosed in the above referenced U.S. Pat. No. 3,469,982 are generally suitable. Preferably, the pressure rolls are rubber coated to prevent damage to the composite. An adhering agent may be used in place of the heat and pressure means as disclosed in the aforesaid U.S. Pat. No. 3,629,036.

After adhering the light sensitive laminate L to the base material at transfer station S, the support layer 1 is stripped from the laminate such as by tearing or otherwise, thus exposing the photoresist layer 3 which is protected by intermediate layer 2. This provides a surface ready immediately for imagewise exposure if desired, but still protected from dirt, lint and abrasion by virtue of the intermediate layer 2. The support layer need not be cut but preferably is removed continuously and rewound on roll 13, thereby avoiding problems associated with cutting and peeling.

Figure 3:
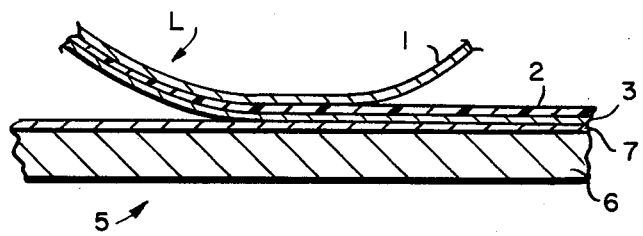
FIG. 3 is an enlarged side sectional view of a base material and light sensitive laminate with portions removed and some dimensions exaggerated for clarity showing different stages of the application of photoresist according to the invention.

In FIG. 3, there is represented an enlarged side sectional view of a base material and light sensitive laminate with some dimensions exaggerated showing different stages of the application of photoresist in accordance with the invention. The base material 6 with copper foil 7 has adhered to it the photoresist layer 3 of the light sensitive laminate L. The support layer 1 of this laminate is then stripped continuously from the composite so formed, thereby leaving the photoresist layer 3 adhered to base material 7 and protected from abrasion and the like by intermediate layer 2.

Since the intermediate layer 2 may be optionally transmitted, the so-formed composite may be imaged directly through intermediate layer 2 without necessity for removal prior to development.

In conjunction with the stripping of the support layer 1 from the light sensitive laminate L, it should be noted that the suppor layer 1 is loosely adhered to the intermediate layer 2 rather than strongly attached thereto to facilitate removal without damage to the photoresist layer 3. By way of contrast, the photoresist layer is firmly bonded to the intermediate layer to prevent separation during stripping of the support layer.

The overall process for applying and developing a photoresist image in accordance with the invention could comprise the following steps:

(1) Adhere a light sensitive laminate to a base material, the method of adhering said laminate to said base material not being critical;

(2) Strip the support layer of said light sensitive laminate from the composite so formed;

(3) Expose the composite so formed image wise to actinic radiation to form a latent image in said photoresist layer; and (4) Contact said exposed photoresist layer with a developer therefor that is also a solvent for the intermediate protective layer for said photoresist layer to form a resist image.

Subsequent to the above procedural steps, the surface can be treated with a suitable agent to form an etched surface, or plated or processed in other ways known to the art. The resist image can then be removed by means of a solvent therefor if desired with the aid of mechanical action such as by rubbing, brushing, and/or abrading, or by a combination of one or more of such steps as is known in the art.

It should be noted that in the above described process, the intermediate layer may be removed by washing prior to the step of exposing the photoresist layer, but this is a lesser preferred embodiment of the invention even though following this procedure, the intermediate layer need not be optionally transmitting nor soluble in a developer for the photoresist. Moreover, with respect to step 4, this step can be split into two steps, the first of which would comprise removing the intermediate layer and the second of which would comprise developing the exposed resist layer. In this embodiment of the invention, the intermediate layer would have to be of a material that is soluble in a solvent that does not attack the resist layer. This embodiment of the invention is less preferred as it involves an extra step in the development procedure.

The invention will be further illustrated by the following examples:

EXAMPLE 1

A light sensitive laminate is prepraed corresponding to that depicted in FIG. 1 of the drawings. The photoresist layer and the intermediate layer are applied by roller coating processes using rollers rotating through a solution of the applicable material. The supporting substrate is a release paper identified as Transkote AV available from S.D. Warren Co. The intermediate protective layer is applied as a 15 to 20 per cent by weight solids solution of Gantrez AN-139 of General Aniline and Film Corporation. This material is a medium viscosity, water soluble copolymer of vinylmethyl ether and maleic anhydride. The photoresist layer is applied as a 20 per cent by weight solids solution of AZ-119 Photoresist of Shipley Company Inc. This material comprises a major portion of an alkali soluble phenol-formaldehyde Novolak resin and an o-quinone diazide photosensitizer (comprising about $\frac{1}{3}$ of the solids) dissolved in a predominantly Cellosolve acetate solvent. The dry film thickness of each of the intermediate layer and the photoresist layer is about 10 millionths of a inch.

A copper clad circuit board base material is coated with the so-prepared laminate using, for example, the apparatus of FIG. 2. The laminate is applied to the circuit board base material with the photoresist layer face downward in contact with the copper cladding using rubber-covered rollers operated at about 120° C. with a pressure of about 10 to 12 pounds per lineal inch at the nip, at a rate of about two feet per minute. The paper support layer is removed by peeling the same from the laminate which is adhered to the circuit board base mateiral. This leaves a composite comprising the circuit board base material having adhered to it the photoresist film which is covered by the intermediate protective layer.

Since the intermediate protective layer is optically transmitting, the photoresist layer may be exposed without removal of this intermediate layer. Accordingly, the resist layer is exposed for about 2.5 minutes through a transparency, positive or negative, as desired, using a carbon arc of an intensity of about 2,000 foot candles at a distance of about one foot as a light source. The exposed photoresist is then developed and the intermediate layer simultaneously removed by immersion or swabbing with a developer such as AZ-303 of Shipley Company Inc. comprising an aqueous hydroxide solution. If immersion is employed, it is effected for a few minutes at a temperature of about 70° F. Resolution of the developed image is excellent.

If a positive of the desired circuit pattern is used, the copper exposed by the developing operation is etched away, the photoresist remaining is removed, and the exposed copper is metal plated. If a negative of the desired circuit pattern is used, the copper exposed by development is metal coated with a solder mask, the photoresist is removed and exposed copper etched away.

EXAMPLE 2

The procedure of Example 1 is repeated but the intermediate protective layer is removed by washing prior to exposure with substantially equivalent results.

EXAMPLE 3

The procedure of Example 1 can be repeated substituting a photoresist composition identified as Dynachem Photoresist (DCR) on the backing layer in place of the AZ-119 resist.

EXAMPLE 4

The procedure of Example 1 is repeated drilling through holes subsequent to adhering the laminate to the circuit board base material and prior to removing the support layer from the laminate.

EXAMPLE 5

The procedure of Example 1 is repeated substituting a negative photoresist composition identified as KPR Photoresist of Eastman Kodak Co. believed to be a cinnamic acid based material containing about 17 percent by weight solids. Exposure through the intermediate layer is for 30 seconds using the same light source. Development is by immersion in trichloroethylene for about one minute.

We claim:

1. A process for forming a photoresist on a surface which comprises
   (a) adhering a light sensitive laminate to said surface to form a composite, said light sensitive laminate comprising an undeveloped light sensitive layer of a photoresist material free of photographic silver halide emulsion, a support layer therefor and a light transmitting intermediate protective layer between said light sensitive layer and said support layer, said light sensitive layer being firmly adhered to said intermediate layer and said support layer being loosely adhered to said intermediate layer relative to said light sensitive layer, said light sensitive layer being in contact with said surface;
   (b) stripping the support layer from the composite so formed, leaving behind the photoresist material and intermediate layer with the photoresist material in contact with the surface;
   (c) exposing the composite so formed image wise to a source of radiation to form a latent image in said light sensitive layer; and
   (d) developing said latent image with a developer that is a solvent for the intermediate layer and first dissolves said intermediate layer and then develops the light sensitive layer.

2. The process of claim 1 where the intermediate layer of said light sensitive laminate layer has a maximum thickness of 1 mil.

3. The process of claim 1 where the light sensitive layer of said light sensitive laminate comprises a diazo positive working photoresist.

4. The process of claim 3 where the latent image is developed with an alkaline solution.

5. The process of claim 3 the latent image is developed with a solution of an alkaline metal hydroxide.

6. The process of claim 1 where the surface is selected from the group of metal, plastic, ceramic and semiconductors.

7. The process of claim 1 where the surface is a circuit board base material.

8. The process of claim 7 where the circuit board base material is clad with copper and the light sensitive layer of the light sensitive laminate is adhered to said copper clad.

9. The process of claim 1 where the light sensitive laminate is adhered to the surface by means of heat and pressure.

10. The process of claim 1 where the light sensitive laminate is applied as a continuous film and the support layer is continuously removed without cutting said laminate to size.

* * * * *